United States Patent
Ikegami (10) Patent No.: US 8,058,633 B2
(45) Date of Patent: Nov. 15, 2011

(54) PULSE WIDTH MODULATION SIGNAL GENERATING DEVICE, IMAGE DISPLAY APPARATUS INCLUDING PULSE WIDTH MODULATION SIGNAL GENERATING DEVICE, AND PULSE WIDTH MODULATION SIGNAL GENERATING METHOD

(75) Inventor: Tomio Ikegami, Chino (JP)

(73) Assignee: Seiko Epson Corporation, Tokyo (JP)

( * ) Notice: Subject to any disclaimer, the term of this patent is extended or adjusted under 35 U.S.C. 154(b) by 50 days.

(21) Appl. No.: 12/466,765

(22) Filed: May 15, 2009

(65) Prior Publication Data

US 2009/0310633 A1 Dec. 17, 2009

(30) Foreign Application Priority Data

Jun. 17, 2008 (JP) ................................. 2008-157854

(51) Int. Cl.
*G02B 26/10* (2006.01)
*H04N 1/047* (2006.01)

(52) U.S. Cl. ......................... 250/552; 347/249; 347/252

(58) Field of Classification Search .................. 250/552; 372/24, 26, 29.015; 347/252, 249
See application file for complete search history.

(56) References Cited

U.S. PATENT DOCUMENTS

| | | | | |
|---|---|---|---|---|
| 4,419,675 A * | 12/1983 | Neumann et al. | ............. | 347/249 |
| 5,331,342 A * | 7/1994 | Shimatani et al. | ............. | 347/249 |
| 5,742,323 A * | 4/1998 | Fukushima | ................... | 347/246 |
| 6,100,915 A * | 8/2000 | Iwasaki et al. | ................ | 347/249 |
| 6,512,534 B2 * | 1/2003 | Koga | ............................ | 347/249 |
| 6,731,317 B2 * | 5/2004 | Ema et al. | ..................... | 347/135 |
| 6,839,078 B2 * | 1/2005 | Izumiya et al. | ............... | 347/249 |
| 7,170,544 B2 * | 1/2007 | Horiuchi | ........................ | 347/247 |
| 7,364,306 B2 * | 4/2008 | Margulis | ......................... | 353/31 |
| 7,463,278 B2 * | 12/2008 | Ozasa et al. | .................. | 347/249 |
| 7,496,121 B2 * | 2/2009 | Ishida et al. | ............... | 372/38.02 |
| 7,633,245 B2 * | 12/2009 | Pruett | ......................... | 315/291 |
| 2002/0003568 A1* | 1/2002 | Koga | ............................ | 347/249 |
| 2002/0130944 A1* | 9/2002 | Ema et al. | ..................... | 347/132 |
| 2003/0174200 A1* | 9/2003 | Izumiya et al. | ............... | 347/249 |
| 2004/0183891 A1* | 9/2004 | Ishida et al. | .................... | 347/239 |
| 2005/0089069 A1* | 4/2005 | Ozasa et al. | .................... | 372/26 |
| 2006/0150453 A1* | 7/2006 | Martin et al. | ................... | 40/544 |
| 2006/0193357 A1* | 8/2006 | Pruett | ....................... | 372/38.07 |

(Continued)

FOREIGN PATENT DOCUMENTS

JP   A-2001-264660   9/2001

(Continued)

OTHER PUBLICATIONS

Office Action dated Jun. 23, 2011 in U.S. Appl. No. 13/023,073.

*Primary Examiner* — John R Lee
(74) *Attorney, Agent, or Firm* — Oliff & Berridge PLC (57) ABSTRACT

A pulse width modulation signal generating device which generates a pulse width modulation signal for modulating laser beam according to image data includes: a cycle signal output circuit which outputs a cycle signal having a cycle corresponding to a drawing rate for drawing the image data by the laser beam; and a pulse width modulation circuit which receives supply of the image data and the cycle signal and modulates a pulse wave having a cycle determined by the cycle signal by changing duty ratio of the pulse wave based on the image data to produce the pulse width modulation signal.

10 Claims, 11 Drawing Sheets

U.S. PATENT DOCUMENTS

| | | | |
|---|---|---|---|
| 2007/0035706 A1* | 2/2007 | Margulis | 353/122 |
| 2007/0188417 A1* | 8/2007 | Hajjar et al. | 345/75.1 |
| 2008/0180043 A1* | 7/2008 | Pruett | 315/307 |
| 2008/0239252 A1 | 10/2008 | Konno et al. | |
| 2009/0009582 A1* | 1/2009 | Shiraishi | 347/249 |
| 2009/0091708 A1* | 4/2009 | Greene | 353/7 |
| 2009/0310633 A1* | 12/2009 | Ikegami | 372/26 |
| 2011/0128312 A1 | 6/2011 | Ikegami | |

FOREIGN PATENT DOCUMENTS

| | | |
|---|---|---|
| JP | A-2006-323355 | 11/2006 |
| JP | A-2007-047243 | 2/2007 |
| JP | A-2007-140009 | 6/2007 |
| JP | A-2008-170768 | 7/2008 |

* cited by examiner

PULSE WIDTH MODULATION SIGNAL GENERATING DEVICE, IMAGE DISPLAY APPARATUS INCLUDING PULSE WIDTH MODULATION SIGNAL GENERATING DEVICE, AND PULSE WIDTH MODULATION SIGNAL GENERATING METHOD

BACKGROUND

1. Technical Field

The present invention relates to a technology of generating pulse width modulation signals for modulating laser beams according to image data.

2. Related Art

Currently, there is a proposal of a laser scan type projector which displays images by laser beams. Also, a technology of pulse width modulation (PWM) which varies duty ratio of pulse waves having predetermined cycles is known as a laser beam modulation system.

According to the laser scan type projector, the optical path length between a light source and a screen differs according to the drawing position on the screen, which requires the drawing rate to be varied. However, when the laser scan type projector uses PWM signals generated by the PWM system and thus having fixed cycles, modulation of laser beams does not come up with the drawing rate. Thus, images cannot be accurately displayed.

A laser scan type projector disclosed in JP-A-2007-140009 adopts the pulse width modulation (PWM) system. According to this projector, the optical path length is fixed by connecting the same number of optical fibers as that of pixels of images displayed on a screen to the back surface of the screen. In this case, however, the device structure becomes complicated.

SUMMARY

It is an advantage of some aspects of the invention to provide a technology of easily generating pulse width modulation signals used by a laser scan type image display apparatus for achieving accurate image display.

Aspects of the invention can be practiced as following embodiments or application examples.

Application Example 1 of the invention is directed to a pulse width modulation signal generating device which generates a pulse width modulation signal for modulating laser beam according to image data including: a cycle signal output circuit adopted to output a cycle signal having a cycle corresponding to a drawing rate for drawing the image data by the laser beam; and a pulse width modulation circuit adopted to receive the image data and the cycle signal and modulates a pulse wave having a cycle determined by the cycle signal by changing duty ratio of the pulse wave based on the image data to produce the pulse width modulation signal.

According to the pulse width modulation signal generating device having this structure, the cycle signal output circuit outputs the cycle signal to the pulse width modulation circuit, and the pulse width modulation circuit generates the pulse width modulation signal having the cycle determined by the cycle signal. The cycle signal has the cycle corresponding to the drawing rate for drawing the image data by the laser beam. Thus, the cycle of the pulse width modulation signal can be varied according to the drawing rate. For image drawing with variable drawing rate by using an image display apparatus, therefore, the pulse width modulation signal generating device can modulate the laser beam by the pulse width modulation signal synchronized with the drawing rate. Accordingly, the laser scan type image display apparatus can accurately display images by a simple structure using the pulse width modulation system.

Application Example 2 is directed to the pulse width modulation signal generating device according to Application Example 1, wherein the cycle signal output circuit includes a phase synchronization circuit adopted to receive a drawing clock having a cycle corresponding to the drawing rate and output a signal having frequency equal to and phase synchronized with the drawing clock as the cycle signal.

According to this structure, the cycle signal output circuit can be easily structured by a so-called PLL as the phase synchronization circuit.

Application Example 3 is directed to the pulse width modulation signal generating device according to Application Example 2, wherein the cycle signal is a signal having ramp wave, triangle wave, or saw tooth wave.

According to this structure, the pulse width modulation signal can be easily produced from the pulse width modulation circuit disposed downstream by using the cycle signal having ramp wave, triangle wave, or saw tooth wave.

Application Example 4 is directed to the pulse width modulation signal generating device according to any of Application Examples 1 to 3, wherein the drawing rate increases as the drawing position rises in the vertical direction of the drawing image.

According to this structure, accurate image display can be achieved when the position of a laser beam source for emitting laser beams is equivalent to or lower than the lower side of a screen on which images are displayed.

Application Example 5 is directed to the pulse width modulation signal generating device according to Application Example 4, wherein the drawing rate becomes the maximum at the center in the horizontal direction at the same position in the vertical direction, and decreases as the position shifts from the center toward the outside.

According to this structure, the drawing rate in the horizontal direction becomes an appropriate value. Thus, more accurate image display can be achieved.

Application Example 6 is directed to the pulse width modulation signal generating device according to Application Example 1, wherein the pulse width modulation signal generating device further includes an image data memory unit adopted to temporarily store the image data, and adopted to cyclically output respective pixel data constituting the image data based on a data read clock received by the image data memory unit. The cycle signal output circuit includes: a parameter calculating unit adopted to calculate the position of pixel data to be read from the image data memory unit on the image data in the vertical direction and calculates a parameter corresponding to the drawing rate determined by the position in the vertical direction; a phase synchronization circuit adopted to receive a system clock having a predetermined cycle and the parameter and outputs a signal having a cycle calculated by dividing the predetermined cycle by a number corresponding to the parameter as the cycle signal; and a waveform shaper adopted to shape an oscillation signal from the phase synchronization circuit and outputs the shaped signal as the data read clock.

According to this structure, the cycle signal output circuit can be easily structured by a so-called PLL as the phase synchronization circuit. Particularly in this structure, the pulse width modulation signal generating device determines the parameter corresponding to the drawing rate and reads respective pixel data of the image data from the image data memory unit with the cycle determined by the parameter.

Thus, the actual drawing rate of the image data can be synchronized with the cycle of the pulse width modulation signal with high accuracy.

Application Example 7 is directed to the pulse width modulation signal generating device according to Application Example 6, wherein the cycle signal is a signal having ramp wave, triangle wave, or saw tooth wave.

According to this structure, the pulse width modulation signal can be easily produced from the pulse width modulation circuit disposed downstream by using the cycle signal having ramp wave, triangle wave, or saw tooth wave.

Application Example 8 is directed to the pulse width modulation signal generating device according to Application Example 6 or 7, wherein the drawing rate increases as the drawing position rises in the vertical direction of the drawing image.

According to this structure, accurate image display can be achieved when the position of a laser beam source for emitting laser beams is equivalent to or lower than the lower side of a screen on which images are displayed.

Application Example 9 is directed to an image display apparatus including: the pulse width modulation signal generating device described in any of Application Examples 1 through 4; and an upper device adopted to receive an image signal containing the image data from the outside, and adopted to transmits the drawing clock based on the image signal to the pulse width modulation signal generating device.

Application Example 10 is directed to an image display apparatus including: the pulse width modulation signal generating device described in any of Application Examples 4 through 7; and an upper device adopted to receive an image signal from the outside, and adopted to transmits image data contained in the image signal to the image data memory unit, and a vertical synchronous signal and a horizontal synchronous signal contained in the image signal to the parameter calculating unit.

According to the image display apparatuses of Application Examples 9 and 10, accurate image display can be achieved by a simple structure using the pulse width modulation system.

Application Example 11 is directed to a pulse width modulation signal generating method which generates a pulse width modulation signal for modulating laser beam according to image data including: outputting a cycle signal having a cycle corresponding to a drawing rate for drawing the image data by the laser beam; receiving the image data and the cycle signal and modulating a pulse wave having a cycle determined by the cycle signal by changing duty ratio of the pulse wave based on the image data to produce the pulse width modulation signal.

For image drawing with variable drawing rate by the image display apparatus according to this pulse width modulation signal generating method, the laser beam can be modulated by the pulse width modulation signal synchronized with the drawing rate similarly to the pulse width modulation signal generating device.

The invention can be practiced in various forms such as a projector, a computer program for providing functions of the pulse width modulation signal generating method, a recording medium storing the computer program, and a data signal containing the computer program and provided on carrier waves.

BRIEF DESCRIPTION OF THE DRAWINGS

Embodiments are described with reference to the accompanying drawings, wherein like numbers reference like elements.

DESCRIPTION OF EXEMPLARY EMBODIMENTS

Exemplary embodiments according to the invention are hereinafter described.

Figure 1:
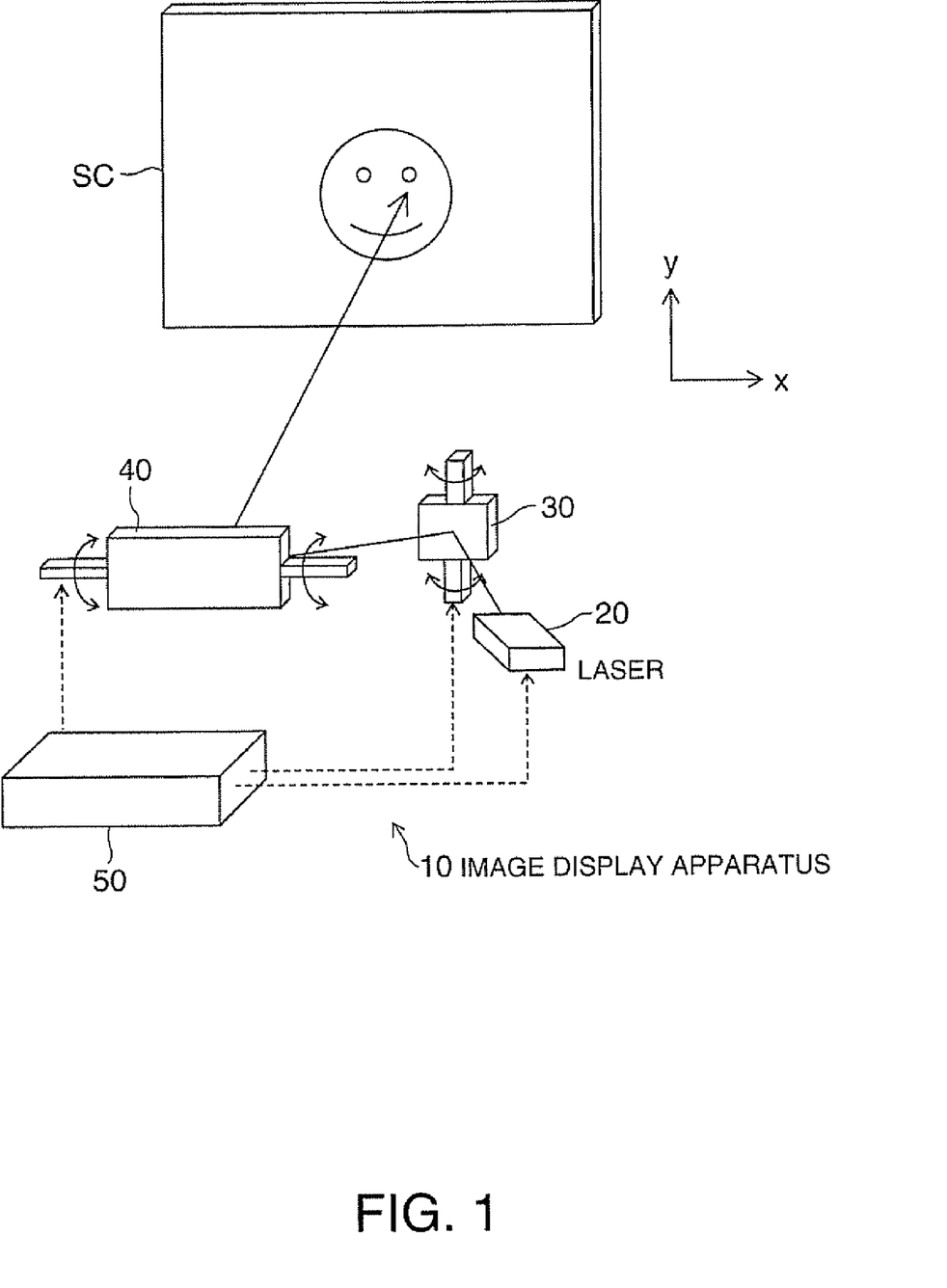
FIG. 1 illustrates an image display apparatus and a screen according to a first embodiment of the invention.

FIG. 1 illustrates an image display apparatus 10 and a screen SC according to a first embodiment. The image display apparatus 10 is a so-called projector. As illustrated in the figure, the image display apparatus 10 has a laser beam source 20. In practical use, the image display apparatus 10 has respective laser beam sources for projecting red light, green light, and blue light. However, only one laser beam source 20 is shown in this example for easy understanding of the explanation. The laser beam source 20 is constituted by a semiconductor laser, for example.

The image display apparatus 10 also includes a horizontal scanning mirror 30 for scanning in a horizontal direction (main scanning direction) x, and a vertical scanning mirror 40 for scanning in a vertical direction (sub scanning direction) y. The horizontal scanning mirror 30 is constituted by a resonance type reflection mirror in this embodiment. The vertical scanning mirror 40 is constituted by a reflection mirror. Laser beams outputted from the laser beam source 20 are reflected by the horizontal scanning mirror 30 toward the vertical scanning mirror 40 and further reflected by the vertical scanning mirror 40 toward the screen SC to finally reach the screen SC.

The image display apparatus 10 further includes a control device 50. The image display apparatus 10 receives input of image signal AV from an external device such as a player, a video deck, and a personal computer, and the control device 50 extracts the inputted image signal AV. The control device 50 is constituted by a microcomputer, a discrete electronic circuit or the like, and performs various control processes according to the image signal AV. The control processes include process for driving the laser beam source 20, and the process for swinging the horizontal scanning mirror 30 and the vertical scanning mirror 40. Laser beams are modulated by driving the laser beam source 20 based on image data contained in the image signal AV, and are applied for scanning in the main scanning direction x and the sub scanning direction y by swinging the horizontal scanning mirror 30 and the vertical scanning mirror 40.

Figures 2A, 2B:
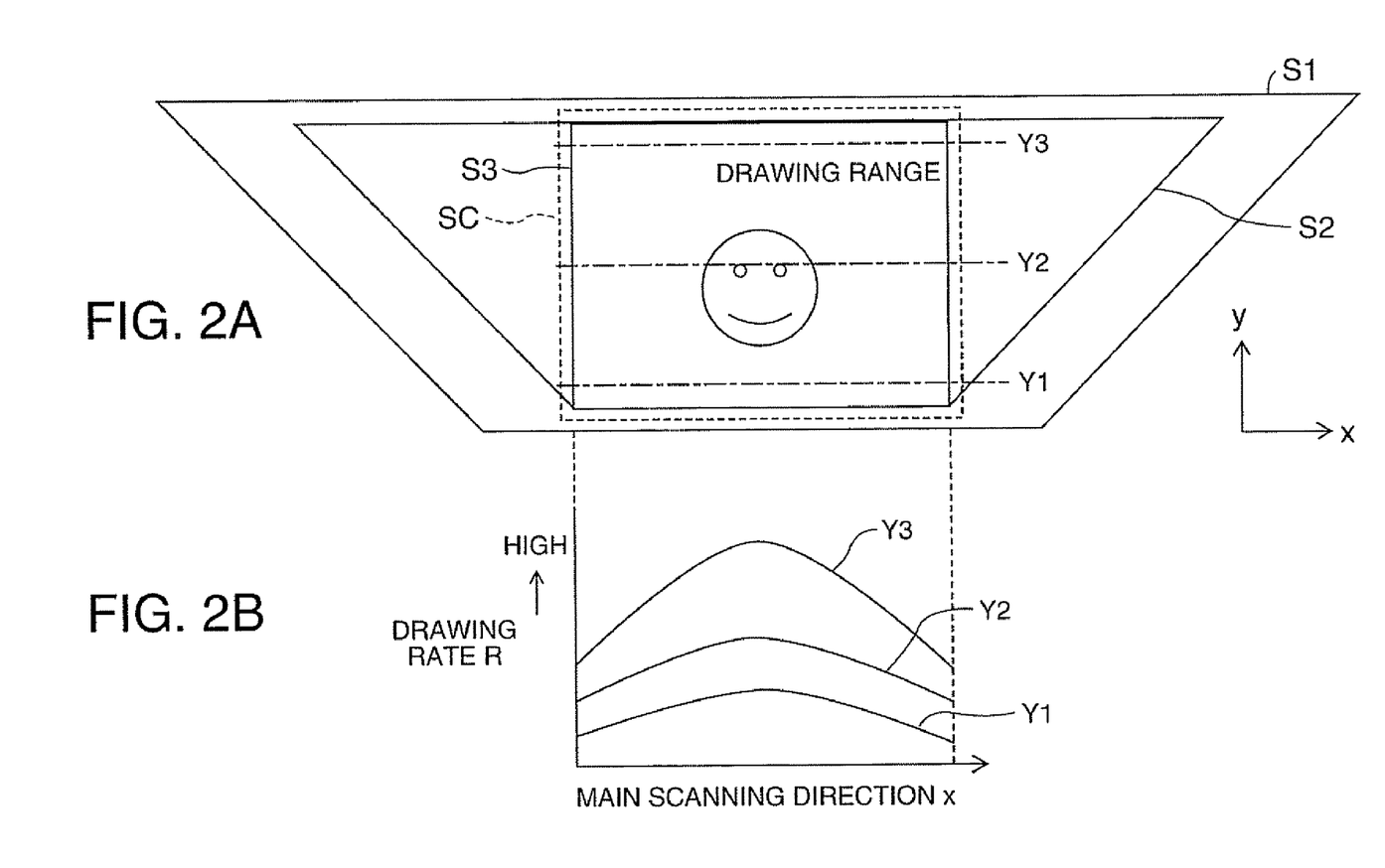
FIGS. 2A and 2B illustrate image drawing on the screen by the image display apparatus.

FIGS. 2A and 2B illustrate drawing of image data on the screen SC by using the image display apparatus 10 having the structure described above. FIG. 2A shows the relationship between a laser beam projection allowable range S1, a drawing allowable range S2, and an actual drawing range S3 of laser beams. When the installation position of the image display apparatus 10 is equivalent to or lower than the lower side of the screen SC, the laser beam projection allowable range S1 on a flat plane containing the screen SC has a trapezoidal shape (upper side is longer than lower side). This is because the scanning allowable range provided by the horizontal scanning mirror 30 becomes larger as the position in the sub scanning direction y provided by the vertical scanning mirror 40 rises.

The drawing range S2 provided by the image display apparatus 10 has a trapezoidal shape within the projection allowable range S1. On the other hand, the actual drawing range S3 provided by the image display apparatus 10 has a rectangular shape having a length equivalent to the length of the lower side of the drawing allowable range S2. That is, for obtaining a desirable rectangular drawing shape, the image display apparatus 10 uses a major part of the lower side of the drawing allowable range S2 for the lower side of the display image, and a part of the upper side of the drawing allowable range S2 for the upper side of the display image.

An alternate long and short dash line Y1 shown in FIG. 2A indicates a scanning line in the main scanning direction x (hereinafter referred to as "main scanning line") when the position in the sub scanning direction y is low. An alternate long and short dash line Y2 indicates the main scanning line when the position in the sub scanning direction y is middle. An alternate long and short dash line Y3 indicates the main scanning line when the sub scanning direction y is high.

FIG. 2B is a graph showing the relationship between a drawing rate R for drawing image data by the image display apparatus 10 and drawing positions in the drawing range S3. The term "drawing rate" refers to a speed at which image data is displayed (drawn) on the screen SC. A lower solid line in the graph represents variations in the drawing rate R on the main scanning line at the time of Y1, that is, when the position in the sub scanning direction y is low. A middle solid line in the graph represents variations in the drawing rate R on the main scanning line at the time of Y2, that is, when the position in the sub scanning direction y is middle. A higher solid line in the graph represents variations in the drawing rate R on the main scanning line at the time of Y3, that is, when the position in the sub scanning direction y is high.

As can be understood, the image display apparatus 10 decreases the drawing rate R in the lower part of the drawing image, and increases the drawing rate R in the upper part of the drawing image. That is, the image display apparatus 10 draws images setting the drawing rate R at a larger value as the drawing position on the drawing image rises in the sub scanning direction y. As a result, the image display apparatus 10 can draw images based on the condition as can be seen from FIG. 2A, that is, using the major part of the lower side of the drawing allowable range S2 for the lower part of the display image and a part of the upper side of the drawing allowable range S2 for the upper side of the display image.

In this example, the variations in the drawing rate R according to the position in the sub scanning direction y are shown. However, in practical use, the drawing rate R needs to be varied according to the position in the main scanning direction x. More specifically, the drawing rate R needs to be varied according to the position in the main scanning direction x since the optical path length until the screen and cycle of the rotation speed of the resonance type reflection mirror vary according to the position in the main scanning direction x. Thus, as illustrated in FIG. 2B, the image display apparatus 10 draws images setting the drawing rate R at the maximum at the center position in the main scanning direction x for the same position in the sub scanning direction y and decreasing the drawing rate R as the position shifts from the center toward the outside.

Figure 3:
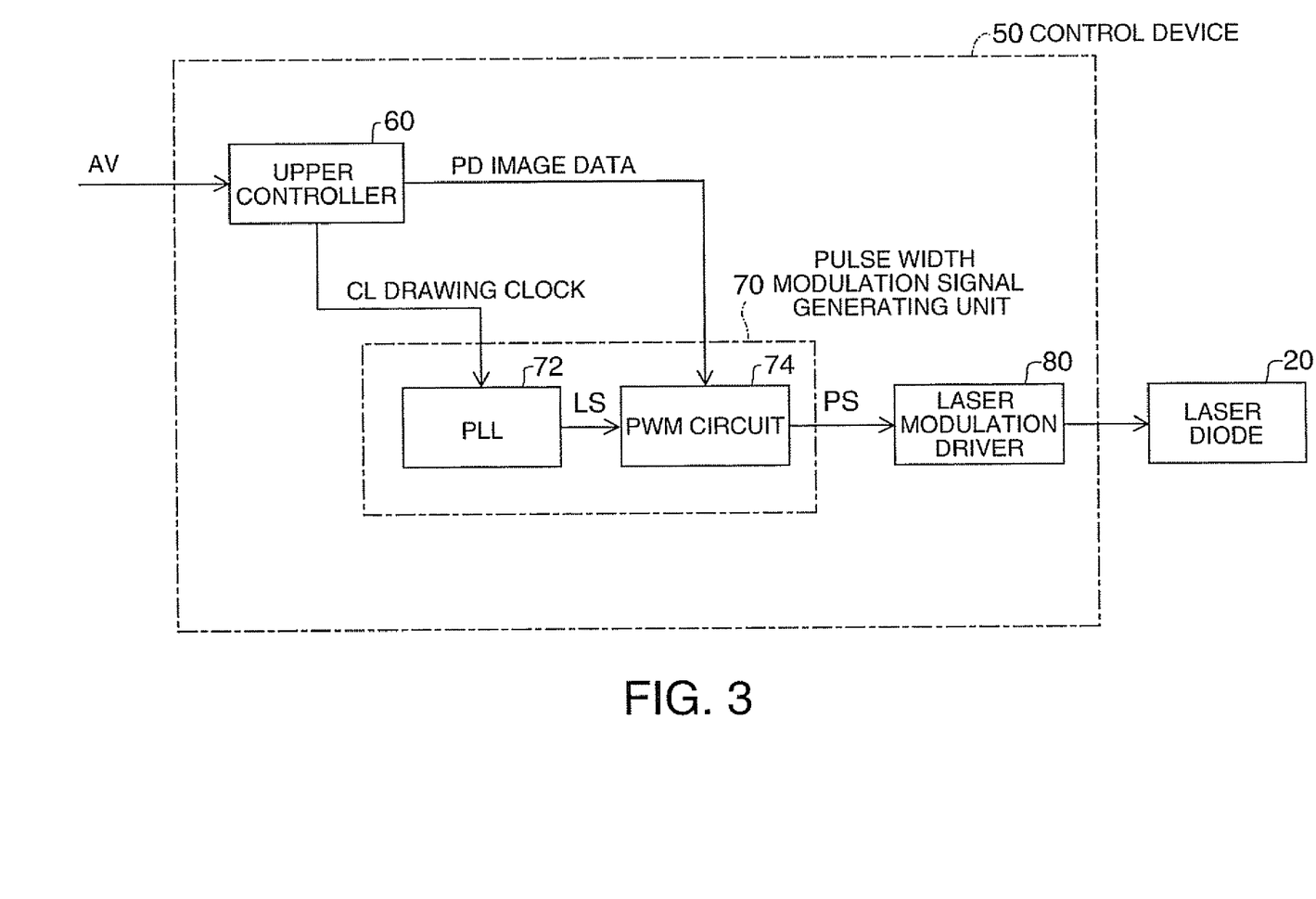
FIG. 3 is a block diagram showing a part of the internal structure of a control device.

FIG. 3 is a block diagram showing a part of the internal structure of the control device 50. As illustrated in the figure, the control device 50 includes an upper controller 60, a pulse width modulation signal generating unit 70, and a laser modulation driver 80. The control device 50 further includes components such as a scan control unit for swinging the horizontal scanning mirror 30 and the vertical scanning mirror 40, which are not shown in the figure.

The upper controller 60 is constituted by a microcomputer and outputs image data PD and drawing clock CL. More specifically, the upper controller 60 sequentially outputs the image data PD pixel by pixel at a predetermined drawing rate. The image data includes red light data, green light data, and blue light data, but only image data PD for one color is shown in the figure. The drawing clock CL is a pulse signal having the cycle corresponding to the predetermined drawing rate. More specifically, the upper controller 60 sequentially outputs the image data PD pixel by pixel according to the predetermined drawing rate, and outputs the drawing clock CL for synchronizing with the drawing rate. The image data PD and the drawing clock CL are transmitted to the pulse width modulation signal generating unit 70.

The drawing rate is a value satisfying the relationship shown in the graph in FIG. 2B. More specifically, the drawing rate increases as the drawing position rises in the sub scanning direction y of the drawing image for one frame. Also, the drawing rate R becomes the maximum at the center in the main scanning direction x for the same position in the sub scanning direction y, and decreases as the position shifts from the center toward the outside.

As illustrated in FIG. 3, the pulse width modulation signal generating unit 70 has a phase synchronization circuit (hereinafter referred to as "PLL") 72, and a pulse width modulation circuit (hereinafter referred to as "PWM circuit") 74. The PLL 72 receives supply of the drawing clock CL from the upper controller, and outputs ramp wave LS having frequency equal to and phase synchronized with those of the drawing clock CL. The PLL 72 corresponds to the "cycle signal output circuit" as a constituting element included in the appended claims. The ramp wave LS corresponds to the "cycle signal" in the appended claims. The PWM circuit 74 having received supply of the image data PD from the upper controller 60 and supply of the ramp wave LS from the PLL 72 modulates pulse waves having a cycle determined by the ramp wave LS by changing the duty ratio of the pulse waves based on the image data PD to generate a pulse width modulation signal PS. The pulse width modulation signal PS generated by the PWM circuit 64 is transmitted to the laser modulation driver 80. The laser modulation driver 80 drives the laser beam source 20 according to the pulse width modulation signal PS.

Figure 4:
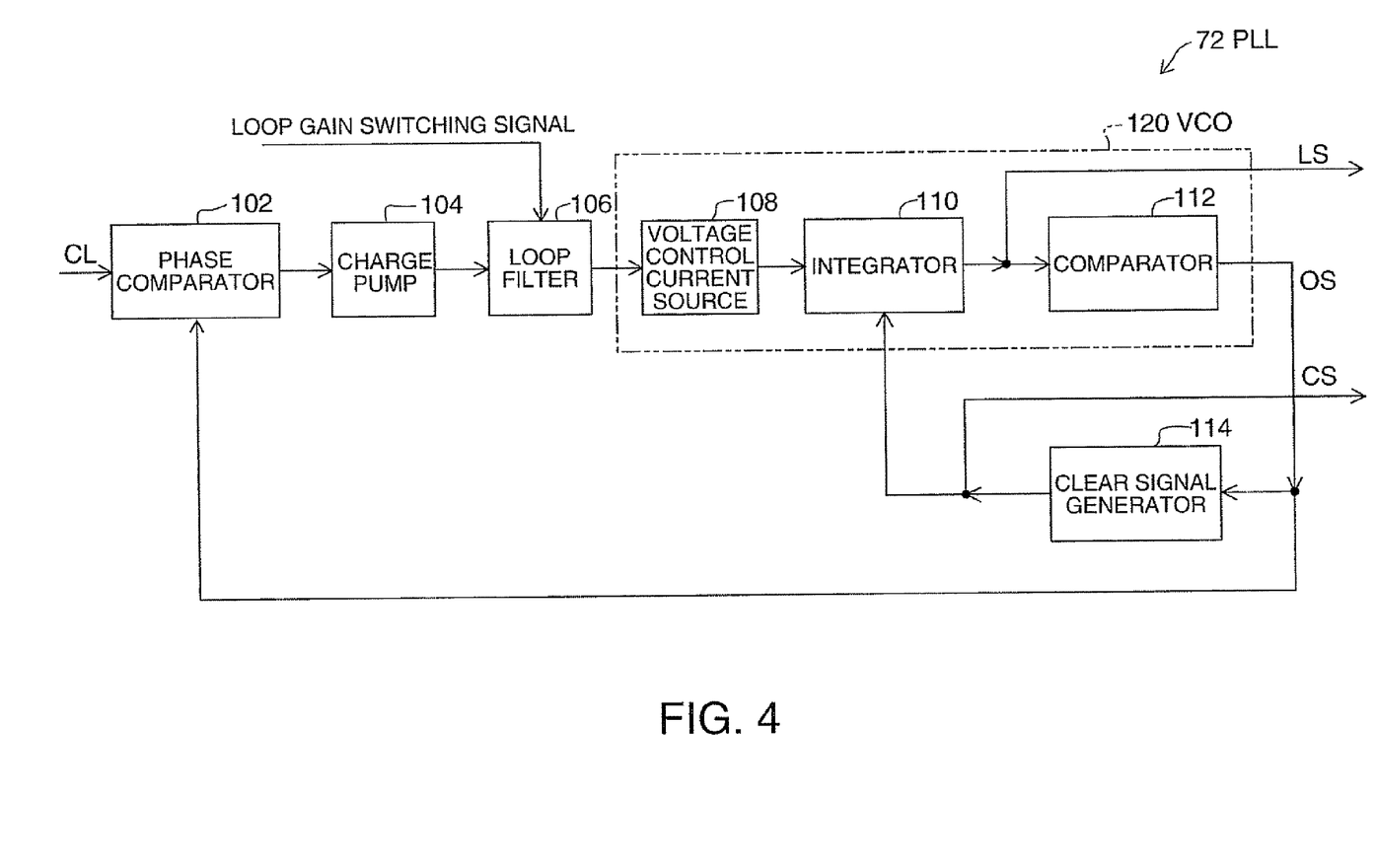
FIG. 4 is a block diagram showing the detailed circuit structure of a PLL.

FIG. 4 is a block diagram showing the detailed circuit structure of the PLL 72. As illustrated in the figure, the PLL 72 includes a phase comparator 102, a charge pump 104, a loop filter 106, a voltage control current source 108, an integrator 110, and a comparator 112. The respective components 102 through 112 are connected in series in this order. The voltage control current source 108, the integrator 110, and the comparator 112 constitute a VCO (voltage control oscillating circuit) 120. The phase comparator 102 receives supply of the drawing clock CL from the upper controller 60, and PLL oscillation signal OS from the VCO 120. The phase comparator 102 forms feedback loop by receiving the PLL oscillation signal OS from the VCO 120. The PLL 72 has a clear signal generator 114. The clear signal generator 114 generates clear signal from the PLL oscillation signal OS received from the VCO 120, and outputs clear signal CS to the integrator 110 and the outside.

The PLL 72 having this structure detects phase difference between the drawing clock CL and the PLL oscillation signal OS received from the VCO 120 by using the phase comparator 102, and outputs a signal proportional to the phase difference through the charge pump 104. Then, the PLL 72 executes processing such as integration by using the loop filter 106, and supplies the resultant signal to the VCO 120. The VCO 120 controls the frequency of the PLL oscillation signal OS by inputted voltage. By the control of the VCO 120, the PLL 72 can oscillate signals having frequency accurately synchronized with the drawing clock CL by returning the PLL oscillation signal OS received from the VCO 120 to the phase comparator 102 for looping of the signal OS. The output from the integrator 110 corresponds to the ramp wave LS which is transmitted to the PWM circuit 74. The clear signal generator 114 clears the output from the integrator 110.

Figure 5:
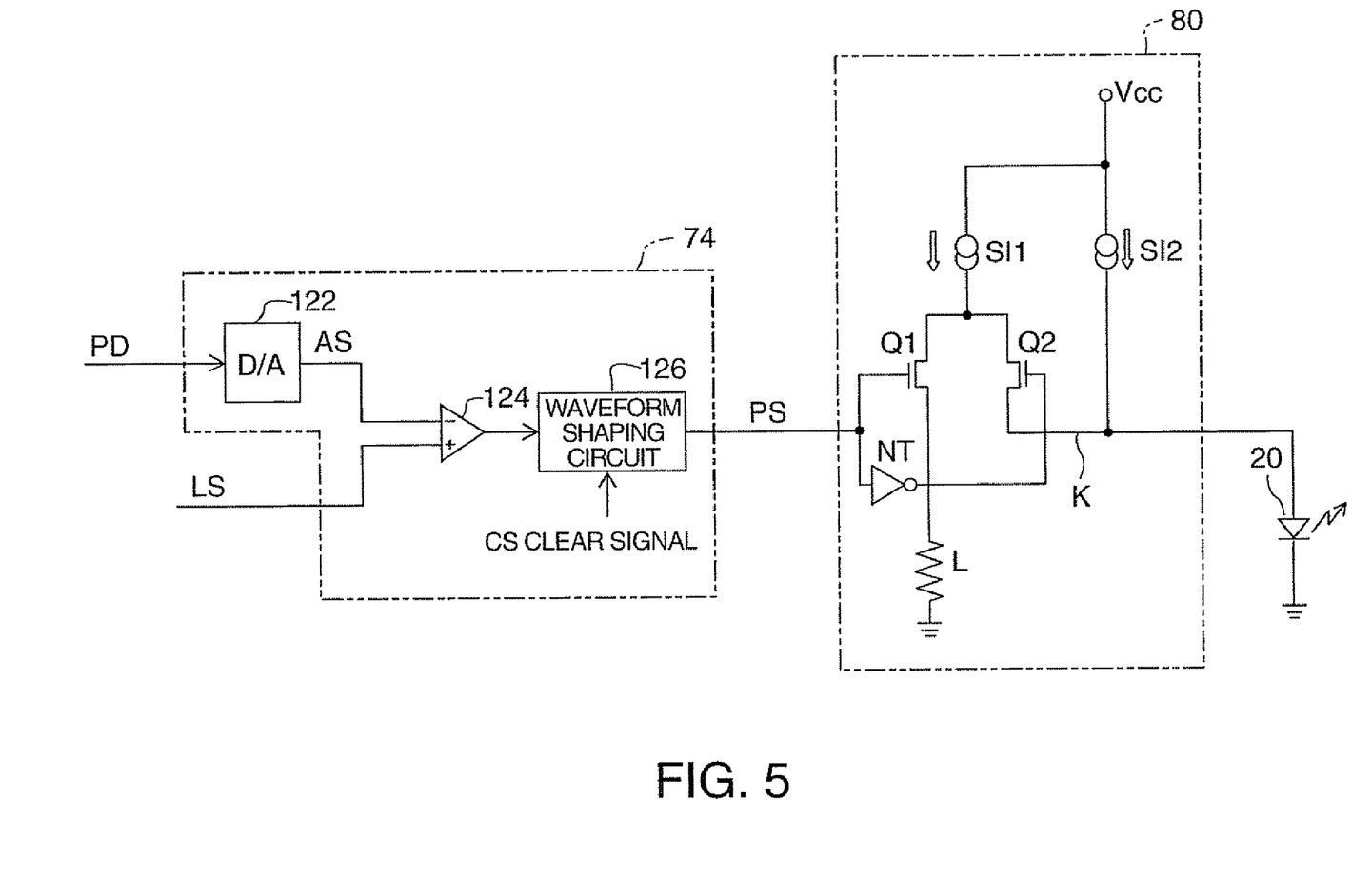
FIG. 5 is a block diagram showing respective structures of a PWM circuit and a laser modulation driver.

FIG. 5 is a block diagram showing the respective structures of the PWM circuit 74 and the laser modulation driver 80. As illustrated in the figure, the PWM circuit 74 includes a D/A converter 122, a comparator 124, and a waveform shaping circuit 126. The PWM circuit 74 converts digital data included in the image data PD transmitted from the upper controller 60 into analog data by using the D/A converter 122, and compares analog signal AS outputted from the D/A converter 122 with the ramp wave LS transmitted from the PLL 72 by using the comparator 124. Then, the PWM circuit 74 shapes the waveform of output signal indicating the comparison result into ramp shape by using the waveform shaping circuit 126, and outputs the shaped signal to the laser modulation driver 80 as PWM signal.

The laser modulation driver 80 includes a first transistor Q1, a second transistor Q2, an inverter NT, a first current source SI1 for supplying bias current, and a second current source SI2 for supplying current necessary for emission by the laser beam source 20. The first transistor Q1 and the second transistor Q2 are connected in series by binding respective drain lines, and the second current source SI2 is connected to the binding portion. The PWM signal from the PWM circuit 74 is supplied to the gate of the first transistor Q1, and the PWM signal from the PWM circuit 74 is supplied to the gate of the second transistor Q2 via the inverter NT. The source of the first transistor Q1 is grounded via dummy load L, and the source of the second transistor Q2 is connected to the laser beam source 20 via a connection line K. The first current source SI1 is connected with the connection line K.

The laser modulation driver 80 having this structure switches between addition of current from the second current source SI2 and non-addition of this current by switching operation of the first and second transistors Q1 and Q2 in response to the PWM signal PS while constantly supplying bias current to the laser beam source 20 from the first current source SI1. By this method, the laser modulation driver 80 can switch between ON/OFF of the laser beam source 20 according to the PWM signal PS.

Figure 6:
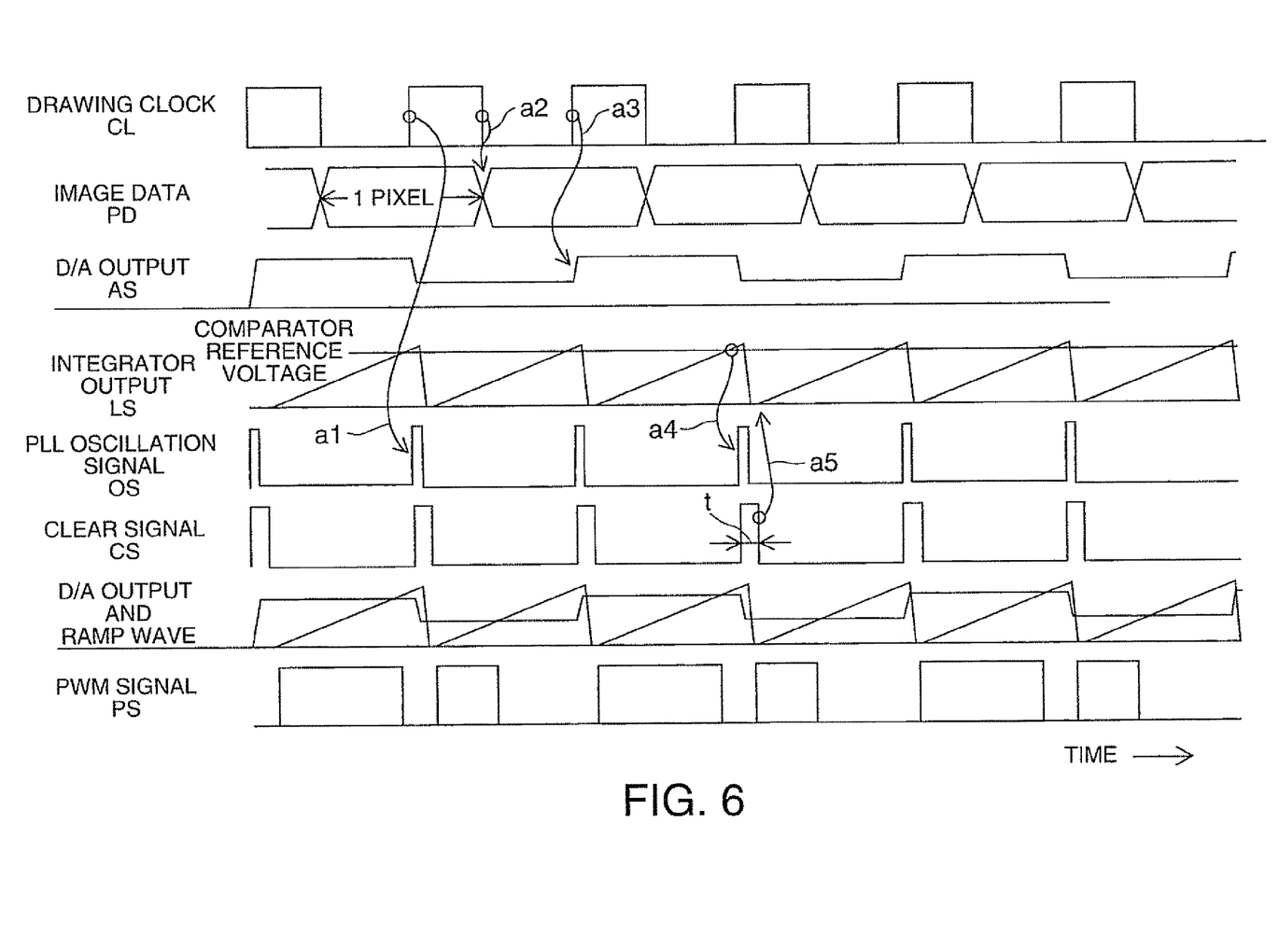
FIG. 6 is a timing chart showing signal waveform changes produced in a pulse width modulation signal generating unit.

FIG. 6 is a timing chart showing signal waveform changes produced in the pulse width modulation signal generating unit 70. As shown in the figure, the rise edges of the drawing clock CL and the PLL oscillation signal OS agree with each other after the PLL 72 finishes extracting operation (see arrow a1). The image data PD is transmitted in synchronization with the drawing clock CL. More specifically, the image data PD is updated by the subsequent pixel with fall of the drawing clock CL (see arrow a2), and output AS from the D/A converter 122 is updated to new data with rise of the drawing clock CL (see arrow a3). The output AS from the D/A converter 122 becomes voltage corresponding to the new data.

When output LS from the integrator 110 of the PLL 72 (FIG. 4) reaches reference voltage supplied to the comparator 112 (comparator reference voltage) by voltage increase with constant inclination, the PLL oscillation signal OS as the output from the comparator 112 rises (see arrow a4). A clear signal having predetermined time width t is generated by the clear signal generator 114 with the rise of the PLL oscillation signal OS to clear the integrator 110. After the clear signal is finished, the output LS from the integrator 110 starts increasing (see arrow a5). As a result, the output LS from the integrator 110 becomes ramp wave having frequency equal to and phase synchronized with those of the drawing clock CL.

Then, the ramp wave LS is compared with the output AS from the D/A converter 122 by the comparator 124. The comparison result is masked by the clear signal CS (XOR is produced) by the waveform shaping circuit 126 to obtain the PWM signal PS. As can be seen from the figure, the PWM signal PS thus obtained becomes a signal having the same cycle as that of the drawing clock CL.

According to this embodiment, the image display apparatus 10 has the PLL 72 as the "cycle signal output circuit". However, the PLL requires certain time for the extracting operation. Also, the operation of the PLL becomes unstable when the drawing clock CL is not inputted to the PLL. In this embodiment, therefore, loop gain switching signal for switching loop gain is inputted to the loop filter 106 of the PLL 72 to solve those problems.

Figure 7:
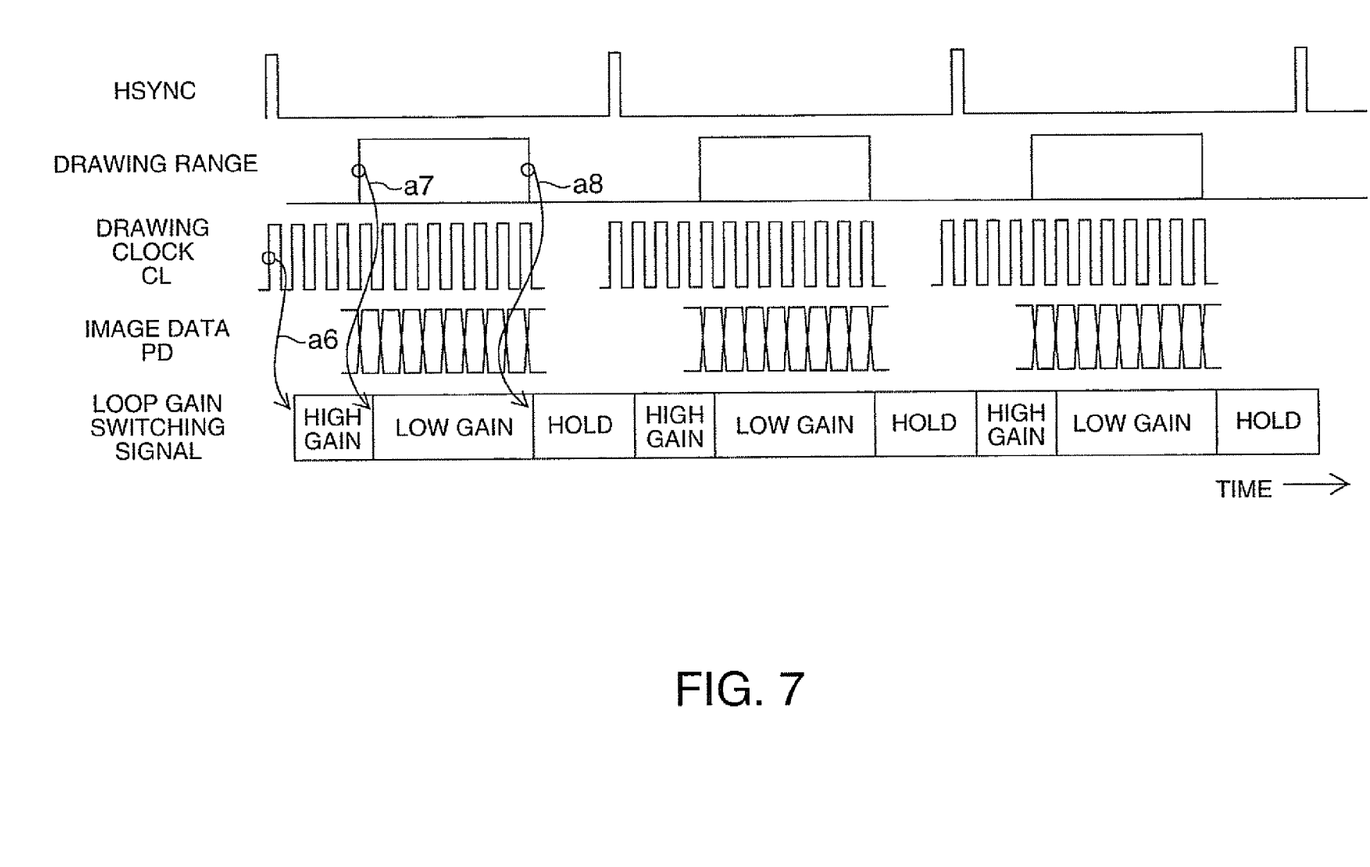
FIG. 7 is a timing chart showing operation sequences associated with switching of loop gain.

FIG. 7 is a timing chart showing operation sequences associated with switching of the loop gain. A horizontal synchronous signal HSYNC shown on the uppermost line is a signal indicating operation start for each of the main scanning lines. Drawing operation is performed between pulses of each pair of the horizontal synchronous signals HSYNC. The drawing area for image drawing in the main scanning direction is shown on the second line in the figure. The upper controller 60 starts outputting the drawing clock CL before the drawing area. The loop gain switching signal to be transmitted to the loop filter 106 is switched to high gain in synchronization with the start of outputting the drawing clock CL (see arrow a6) for the extraction by the PLL. After coming into the drawing area, the loop gain switching signal is switched to low gain (see arrow a7).

According to this structure, the extracting operation by the PLL 72 can be securely completed before start of drawing the image data PD. Thus, the ramp wave LS as cycle signal can be securely transmitted to the PWM circuit 74.

It is possible to hold input from the voltage control current source 108 after the drawing area to which the drawing clock CL is not inputted in a modified example of this embodiment (see arrow a8). In this structure, the oscillation of the PLL can be securely stopped in the non image area.

According to the pulse width modulation signal generating unit 70 included in the image display apparatus 10 having this structure in this embodiment, the PLL 72 generates the ramp wave LS having frequency equivalent to and phase synchronized with the drawing clock CL and outputs the ramp wave LS to the PWM circuit 74. Then, the PWM circuit 74 generates the PWM signal having the cycle determined by the ramp wave LS. Since the drawing clock CL has the cycle corresponding to the predetermined drawing rate, the cycle of the PWM signal becomes the cycle corresponding to the drawing rate. Thus, the pulse width modulation signal generating unit 70 can modulate laser beam by the PWM signal synchronized with the drawing rate when the image display apparatus 10 draws images with variable drawing rate.

As shown in FIG. 2B, the image display apparatus 10 draws images while increasing drawing rate as the drawing position rises in the sub scanning direction y of the drawing image for one frame. Also, the cycle of the PWM signal is synchronized with the drawing rate as discussed above. Thus, modulation of laser beams can follow the drawing rate even when the installation position of the image display apparatus 10 is equal to or lower than the lower side of the screen SC. Accordingly, accurate image display can be achieved.

Figure 8:
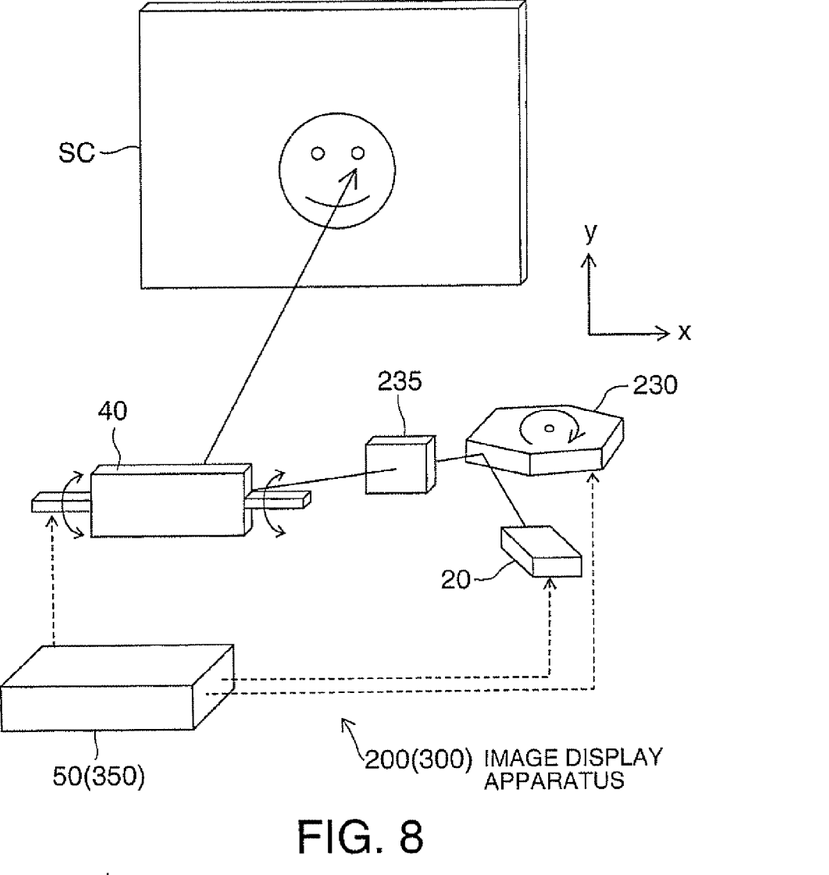
FIG. 8 illustrates an image display apparatus and the screen according to a second embodiment of the invention.

FIG. 8 illustrates an image display apparatus 200 and the screen SC according to a second embodiment of the invention. The image display apparatus 200 has a structure similar to that of the image display apparatus 10 in the first embodiment except for that an Fθ lens 235 is provided between a horizontal scanning mirror 230 and the vertical scanning mirror 40 and that the horizontal scanning mirror 230 is constituted by a polygon mirror instead of the resonance type reflection mirror.

Figure 9:
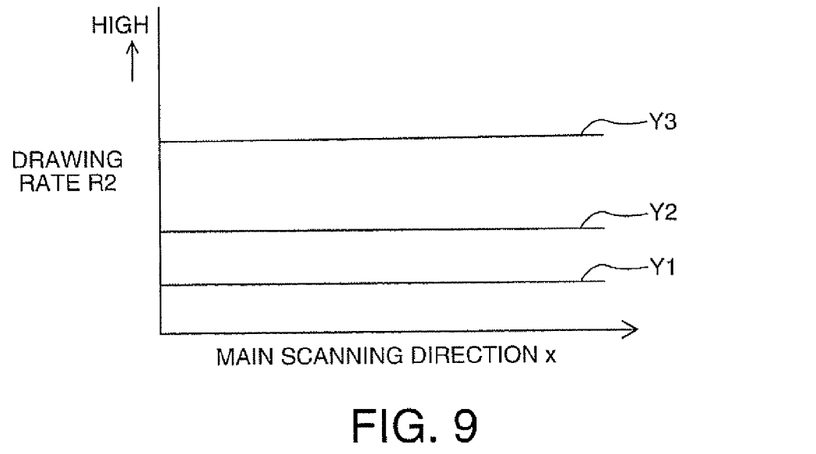
FIG. 9 is a graph showing relationship between a drawing rate and drawing positions according to the second embodiment.

The Fθ lens 235 converges beams deflected by the horizontal scanning mirror 230 on a flat image surface, and therefore can easily perform uniform speed scan. Thus, the image display apparatus 200 in the second embodiment draws images at a drawing rate R2 determined in the graph of FIG. 9. More specifically, in the first embodiment, the image display apparatus 10 increases the drawing rate as the drawing position rises in the sub scanning direction y of the drawing image for one frame, and sets the maximum drawing rate at the center in the main scanning direction x and decreases the drawing rate as the position is shifted toward the outside from the center for the same position in the sub scanning direction y. According to the second embodiment, however, the drawing rate R2 increases as the drawing position rises in the sub scanning direction y of the drawing image for one frame, but becomes the same value at the same position in the sub scanning direction y as illustrated in FIG. 9.

Similarly to the first embodiment, modulation of laser beams can follow the drawing rate even when the installation position of the image display apparatus 200 is equal to or lower than the lower side of the screen SC in the second embodiment. Thus, accurate image display can be achieved. While the horizontal scanning mirror 230 is constituted by the polygon mirror in the second embodiment, the horizontal scanning mirror 230 may be a resonance type reflection mirror as in the first embodiment.

A third embodiment according to the invention is now described. An image display apparatus 300 in third embodiment has the same general structure (hardware structure) as that of the image display apparatus 200 in the second embodiment (see FIG. 8). More specifically, the image display apparatus 300 in the third embodiment has the Fθ lens 235 similarly to the image display apparatus 200 in the second embodiment, and performs uniform speed scan in the main scanning direction x. However, only a control device 350 in the third embodiment is different from the control device in the second embodiment.

Figure 10:
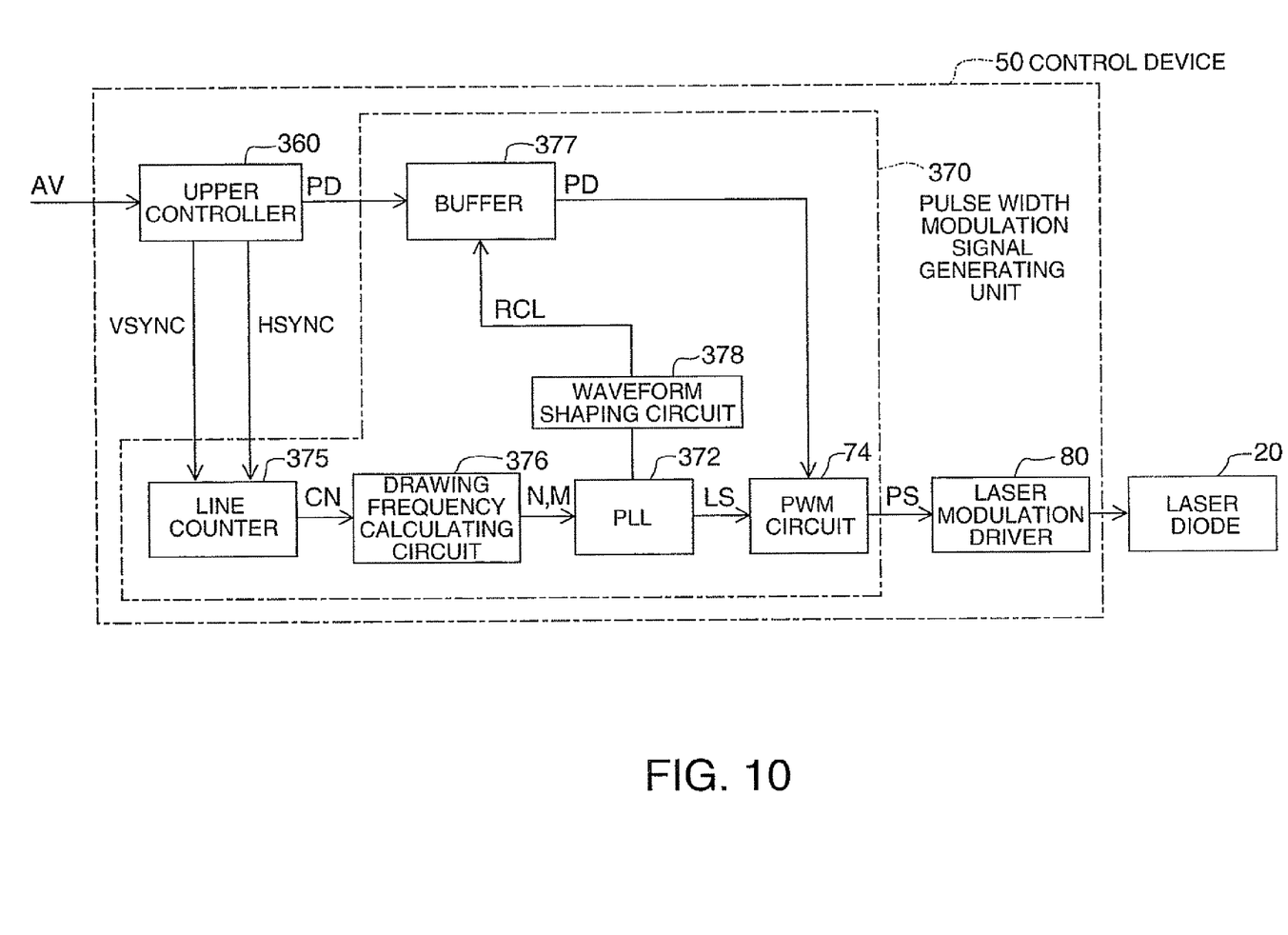
FIG. 10 is a block diagram showing a part of the internal structure of a control device according to a third embodiment of the invention.

FIG. 10 is a block diagram showing a part of the internal structure of the control device 350. As illustrated in the figure, the control device 350 includes an upper controller 360, a pulse width modulation signal generating unit 370, and the laser modulation driver 80. The laser modulation driver 80 has the same structure as that in the first embodiment, and therefore the same reference number is given. The upper controller 360 outputs the image data PD similarly to the first embodiment, but outputs horizontal synchronous signal HSYNC and vertical synchronous signal VSYNC instead of the drawing clock CL outputted in the first embodiment.

The pulse width modulation signal generating unit 370 has a PLL 372, the PWM circuit 74, a line counter 375, a drawing frequency calculating circuit 376, a buffer 377, and a waveform shaper 378. The PWM circuit 74 has the same structure as that in the first embodiment, and therefore the same reference number is given. The buffer 377 receives supply of the image data PD from the upper controller 360 and temporarily stores the image data PD. The buffer 377 cyclically outputs respective pixel data constituting the image data PD based on data read clock RCL as output signal from the waveform shaper 378 described later.

The line counter 375 receives supply of the horizontal synchronous signal HSYNC and the vertical synchronous signal VSYNC from the upper controller 360. The line counter 375 counts the number of the horizontal synchronous signals HSYNC, and clears the count number when receiving the vertical synchronous signal VSYNC to obtain the vertical pixel position of the image data PD outputted from the upper controller 360. The vertical pixel position herein refers to the pixel position in the vertical direction (sub scanning direction) y of the drawing image for one frame. A count number CN indicating the vertical pixel position obtained by the line counter 375 is transmitted to the drawing frequency calculating circuit 376 positioned after the line counter 375.

The drawing frequency calculating circuit 376 is a circuit for calculating parameters M and N corresponding to the drawing rate from the count number CN indicating the vertical pixel position. The "drawing rate" herein refers to the drawing rate R2 shown in FIG. 9. The parameters M and N are two values showing the dividing rates specified for the PLL 372, and the details of the parameters M and N will be described later. The drawing frequency calculating circuit 376 stores first map data indicating the relationship shown in FIG. 9, and second map data indicating the relationship between the drawing rate R and the two parameters M and N in advance. The relationship between the drawing rate R and the parameters M and N will be described later.

When receiving the count number CN showing the vertical pixel position, the drawing frequency calculating circuit 376 calculates the drawing rate R2 based on the vertical pixel position with reference to the first map data, and then calculates the parameters M and N based on the drawing rate R2 with reference to the second map data. While the parameters M and N are calculated from the count number CN by using the first and second map data according to this embodiment, the parameters M and N may be directly obtained from the count number CN by using one map data showing the relationship between the count number CN and the parameters M and N prepared in advance.

Figure 11:
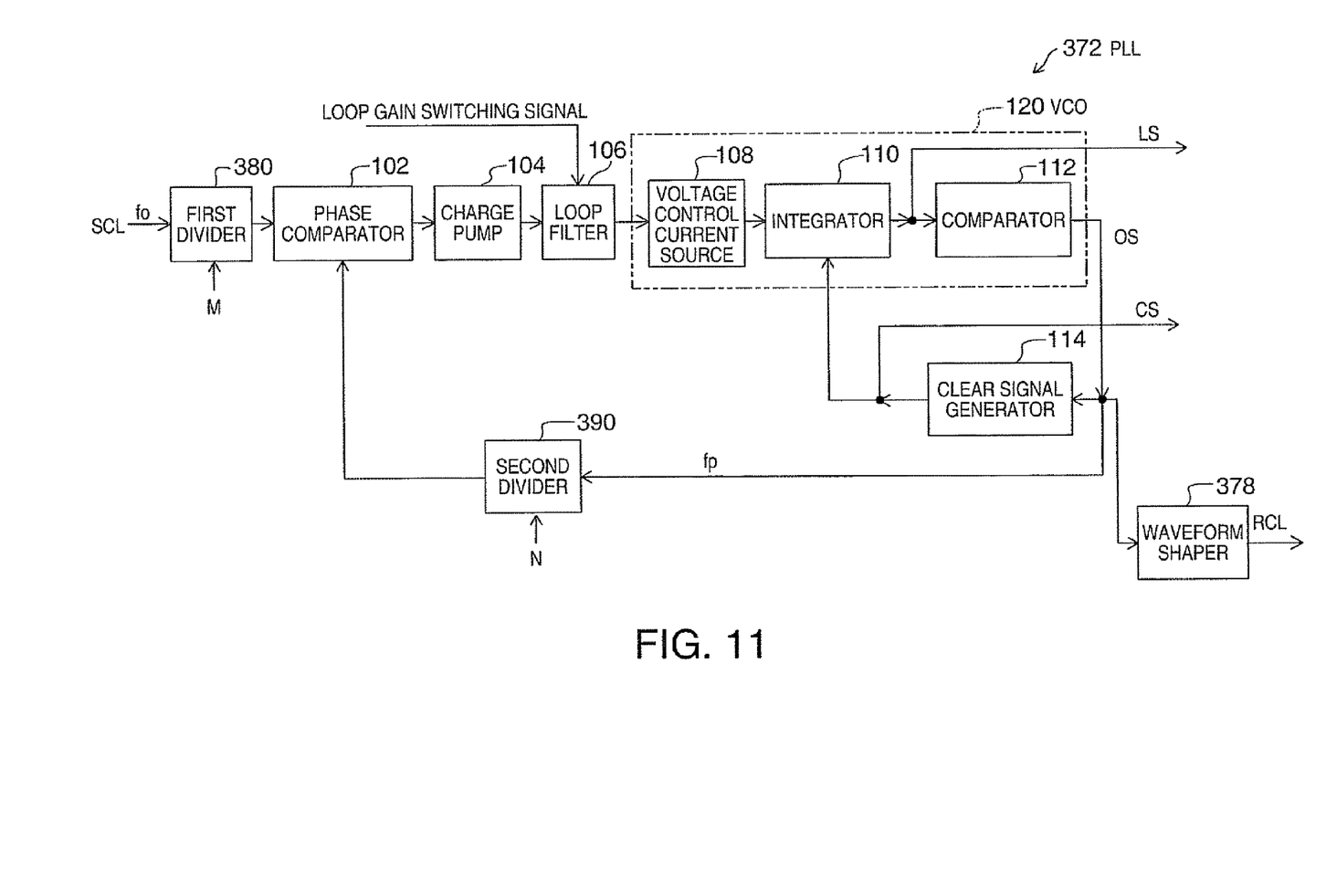
FIG. 11 is a block diagram showing the detailed circuit structure of a PLL.

FIG. 11 is a block diagram showing the detailed circuit structure of the PLL 372. The PLL 372 has the phase comparator 102, the charge pump 104, the loop filter 106, the voltage control current source 108, the integrator 110, and the comparator 112 similarly to the PLL 72 in the first embodiment. These components 102 through 112 have the same structures as those in the first embodiment, and therefore the same reference numbers are given. The PLL 372 in this embodiment further has a first divider 380 and a second divider 390.

The first divider 380 is disposed before the phase comparator 102 to receive input of system clock SCL having predetermined frequency f0 as reference frequency from the outside of the PLL 372. The first divider 380 divides the frequency of the system clock SCL at a dividing rate corresponding to the parameter M outputted from the drawing frequency calculating circuit 376.

The second divider 390 is provided in the course of the feedback loop from the comparator 112 to the phase comparator 102 to divide an oscillation frequency fp of the VCO 120 at a dividing rate corresponding to the parameter N outputted from the drawing frequency calculating circuit 376.

The PLL 372 having this structure has a relation expressed by the following equation (1) between the predetermined frequency f0 determined by the system clock SCL and the oscillation frequency fp:

$$f0/M = fp/N \quad (1)$$

The equation (1) can be transformed into $fp=(N/M) \cdot f0$. As can be seen from this relation, the oscillation frequency can be controlled by varying the parameters M and N inputted to the PLL 372. The parameters M and N are values determined according to the drawing rate R2. Thus, the PLL 372 can output the ramp wave LS synchronized with the cycle corresponding to the drawing rate R2. As a result, the pulse width modulation signal generating unit 370 outputs the PWM signal PS synchronized with the cycle corresponding to the drawing rate R2.

As illustrated in FIG. 11, the output signal OS from the VCO 120 of the PLL 372 is also extracted to the outside of the PLL 372, and transmitted to the buffer 377 as the data read clock RCL after the waveform of the output signal OS is shaped by the waveform shaper 378 (FIG. 10). Since the output signal OS from the VCO 120 is synchronized with the cycle corresponding to the drawing rate R2, the data read clock RCL synchronized with the cycle corresponding to the drawing rate R2 can be supplied to the buffer 377 by shaping the waveform of the output signal OS. Thus, the buffer 377 outputs the image data PD to the PWM circuit 74 pixel by pixel with the cycle corresponding to the drawing rate R2.

Figure 12:
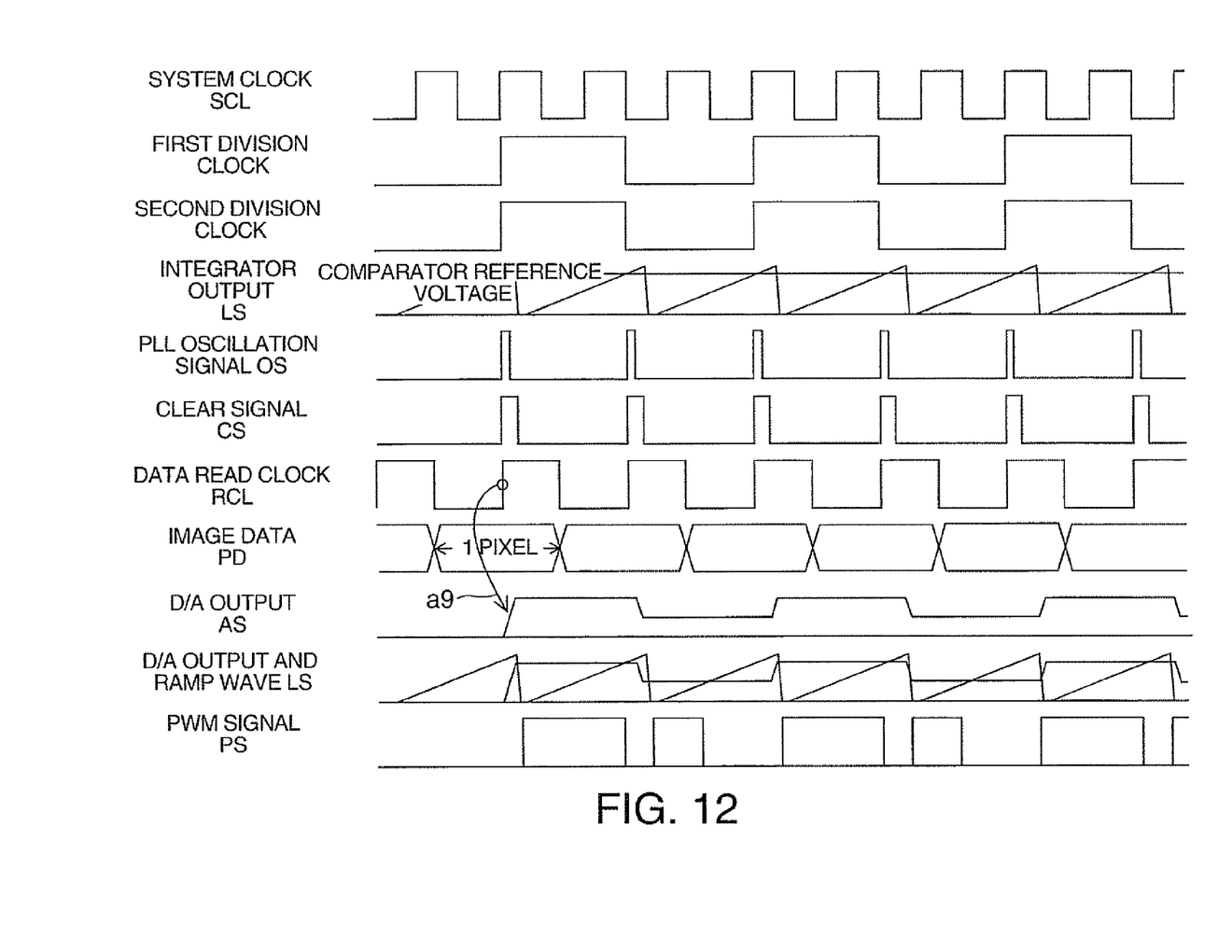
FIG. 12 is a timing chart showing signal waveform changes produced in a pulse width modulation signal generating unit.

FIG. 12 is a timing chart showing signal waveform changes produced in the pulse width modulation signal generating unit 370. As shown in the figure, the system clock SCL is divided into first division clock (⅓ division in the figure) by the first divider 380. The PLL oscillation signal OS is divided into second division clock (½ division in the figure) by the second divider 390. When the extracting operation by the PLL is finished, the frequencies of the two division clocks agree with each other. The waveform shaper 378 produces the data read clock RCL from the PLL oscillation signal OS. Also, the clear signal CS and the ramp wave LS are produced in a manner similar to the first embodiment. Then, the pixel data constituting the image data PD is read from the buffer 377 at the timing of the data read clock RCL, and latched by the D/A converter 122 (see arrow a9). As a result, voltage corresponding to the image data PD is supplied to the output AS from the D/A converter 122, and the output AS is compared with the ramp wave LS to produce the PWM signal PS.

As described above in detail, the pulse width modulation signal generating unit 370 of the image display apparatus 300 according to the third embodiment produces the PWM signal PS synchronized with the cycle corresponding to the drawing rate R2 by using the PLL 372. Thus, the pulse width modulation signal generating unit 370 can modulate laser beams by the PWM signal synchronized with the drawing rate R2 similarly to the first embodiment. Particularly in this embodiment, the PWM is performed with the cycle corresponding to the drawing rate R2 by the pulse width modulation signal generating unit 370, and the respective pixel data of the image data is read from the buffer 377 at the oscillation frequency of the PWM. Thus, the actual drawing rate of the image data can be synchronized with the cycle of the pulse width modulation signal PS with high accuracy.

The invention is not limited to the first through third embodiments and modified examples of these embodiments, but may be practiced otherwise without departing from the scope and spirit of the invention. For example, the following modifications may be made.

(1) While the PLL produces ramp waves as cycle signals in the embodiments, the PLL may generate triangular waves or saw tooth waves instead of ramp waves. The waveform of the cycle signal is not limited to these forms but may be other waveforms as long as signals indicate cycles corresponding to drawing rate. The cycle signal output circuit is not limited to the PLL but may be other oscillator or the like as long as it can output cycle signals having cycles corresponding to drawing rate.

(2) According to the embodiments, the drive current from the laser beam source 20 is directly modulated by the PWM signal produced by the PWM signal generating unit. However, laser beams may be modulated according to PWM signal by inputting PWM signal to an external converter which varies light transmissivity. The pulse width modulation signal generating device according to the invention is applicable to any structures which modulate laser beams by using PWM signal.

(3) The horizontal scanning mirror 30 and the vertical scanning mirror 40 used for laser beam scanning are not limited to the structure in the embodiments but may be other mirrors such as galvano-mirrors. The laser beam source may be solid laser, liquid laser, gas laser, free electron laser, or other types of laser instead of the semiconductor laser.

(4) According to the embodiments, the drawing rate increases as the drawing position rises in the vertical direction of the drawing image. However, the drawing rate is not required to be changed in this manner. When the installation position of the image display apparatus is equal to or higher than the upper side of the screen SC such that laser beams are projected diagonally downward, it is preferable that the drawing rate increases as the drawing position lowers in the vertical direction of the drawing image.

(5) While the drawing rate is stored in the PWM signal generating unit 370 in the third embodiment, the drawing rate may be given to the PWM signal generating unit from the outside. For example, drawing rate map may be created in the PWM signal generating unit based on information about the position of the image display apparatus relative to the screen automatically measured by an image pickup element or the like.

(6) It is possible to provide plural laser beam sources for only one or two color components contained in the R, G, and B color components constituting color images in the embodiments, or to provide plural laser beams for all the color components.

(7) While the image display apparatus according to the embodiments displays image signals, the image display apparatus may display image data of still images.

(8) A part of the structure provided by hardware in the embodiments may be provided by software, and a part of the structure provided by software may be provided by hardware.

The entire disclosure of Japanese Patent Application No. 2008-157854, filed Jun. 17, 2008 is expressly incorporated by reference herein.

What is claimed is:

1. A pulse width modulation signal generating device which generates a pulse width modulation signal for modulating a laser beam according to image data, comprising:
   a cycle signal output circuit adopted to output a cycle signal having a cycle corresponding to a predetermined drawing rate for drawing an image by the laser beam in accordance with the image data; and
   a pulse width modulation circuit adopted to receive the image data and the cycle signal and modulate a pulse wave having a cycle determined by the cycle signal by changing duty ratio of the pulse wave based on the image data to produce the pulse width modulation signal, wherein the predetermined drawing rate increases as the drawing position rises in a vertical direction of the image drawn by the laser beam.

2. The pulse width modulation signal generating device according to claim 1, wherein the cycle signal output circuit includes a phase synchronization circuit adopted to receive a drawing clock having a cycle corresponding to the predetermined drawing rate and output a signal having frequency equal to and phase synchronized with the drawing clock as the cycle signal.

3. The pulse width modulation signal generating device according to claim 2, wherein the cycle signal is a signal having ramp wave, triangle wave, or saw tooth wave.

4. The pulse width modulation signal generating device according to claim 1, wherein the predetermined drawing rate becomes a maximum value at a center position in a horizontal direction for a same position in the vertical direction, and decreases as the position shifts from the center position toward an outside position in the horizontal direction for the same position in the vertical direction.

5. The pulse width modulation signal generating device according to claim 1, further comprising:
   an image data memory unit adopted to temporarily store the image data, and adopted to cyclically output respective pixel data constituting the image data based on a data read clock received by the image data memory unit, wherein the cycle signal output circuit includes
      a parameter calculating unit adopted to calculate the position of pixel data to be read from the image data memory unit on the image data in the vertical direction and calculate a parameter corresponding to the predetermined drawing rate determined by the position in the vertical direction,
      a phase synchronization circuit adopted to receive a system clock having a predetermined cycle and the parameter and output a signal having a cycle calculated by dividing the predetermined cycle by a number corresponding to the parameter as the cycle signal, and
      a waveform shaper adopted to shape an oscillation signal from the phase synchronization circuit and output the shaped signal as the data read clock.

6. The pulse width modulation signal generating device according to claim 5, wherein the cycle signal is a signal having ramp wave, triangle wave, or saw tooth wave.

7. An image display apparatus comprising:
   the pulse width modulation signal generating device according to claim 1; and
   a controller adopted to receive an image signal containing the image data from the outside, and adopted to transmit a drawing clock having a cycle corresponding to the predetermined drawing rate based on the image signal to the pulse width modulation signal generating device.

8. An image display apparatus comprising:
   the pulse width modulation signal generating device according to claim 5; and
   a controller adopted to receive an image signal from the outside, and adopted to transmit image data contained in the image signal to the image data memory unit, and a vertical synchronous signal and a horizontal synchronous signal contained in the image signal to the parameter calculating unit.

9. A pulse width modulation signal generating method which generates a pulse width modulation signal for modulating laser beam according to image data, comprising:
   outputting a cycle signal having a cycle corresponding to a predetermined drawing rate for drawing an image by the laser beam in accordance with the image data; and
   receiving the image data and the cycle signal and modulating a pulse wave having a cycle determined by the cycle signal by changing duty ratio of the pulse wave based on the image data to produce the pulse width modulation signal, wherein the predetermined drawing rate increases as the drawing position rises in a vertical direction of the image drawn by the laser beam.

10. The pulse width modulation signal generating device according to claim 1, wherein a frequency of the cycle signal increases as the predetermined drawing rate increases, and the frequency of the cycle signal decreases as the predetermined drawing rate decreases.

* * * * *